United States Patent
Fujita et al.

(10) Patent No.: US 12,091,346 B2
(45) Date of Patent: Sep. 17, 2024

(54) APPARATUS AND METHOD FOR MANUFACTURING SILICA GLASS CRUCIBLE

(71) Applicant: SUMCO CORPORATION, Tokyo (JP)

(72) Inventors: Takeshi Fujita, Akita (JP); Masanori Fukui, Akita (JP)

(73) Assignee: SUMCO CORPORATION, Tokyo (JP)

( * ) Notice: Subject to any disclaimer, the term of this patent is extended or adjusted under 35 U.S.C. 154(b) by 706 days.

(21) Appl. No.: 17/294,280

(22) PCT Filed: Jan. 10, 2020

(86) PCT No.: PCT/JP2020/000609
§ 371 (c)(1),
(2) Date: May 14, 2021

(87) PCT Pub. No.: WO2020/145378
PCT Pub. Date: Jul. 16, 2020

(65) Prior Publication Data
US 2022/0009815 A1 Jan. 13, 2022

(30) Foreign Application Priority Data
Jan. 11, 2019 (JP) ................................ 2019-003058

(51) Int. Cl.
*C03B 15/10* (2006.01)
*C03B 20/00* (2006.01)
(Continued)

(52) U.S. Cl.
CPC .............. *C03B 20/00* (2013.01); *C30B 15/10* (2013.01); *C30B 29/06* (2013.01)

(58) Field of Classification Search
None
See application file for complete search history.

(56) References Cited

U.S. PATENT DOCUMENTS 4,528,163 A * 7/1985 Albrecht ............... C30B 35/002
65/144
5,063,003 A * 11/1991 Gonzalez-Oliver ...... C03C 3/06
264/6
(Continued)

FOREIGN PATENT DOCUMENTS

CN 201648235 U * 11/2010
CN 108607713 A * 10/2018
(Continued)

OTHER PUBLICATIONS

Kozlov Atomization of melts by a rotating disk with a solidified deposit Plenum Publishing Corporation 1981 (Year: 1981).*
(Continued)

*Primary Examiner* — Jodi C Franklin
(74) *Attorney, Agent, or Firm* — Law Office of Katsuhiro Arai

(57) ABSTRACT

An apparatus for manufacturing a silica glass crucible includes a rotating means for rotating a mold and a supply means for feeding a silica powder inside the mold, wherein the supply means has a feeding part for delivering the silica powder in a manner releasing it to fall to a position away from the inner wall surface of the mold inside the mold, and a dispersing part for changing, to one toward the inner wall surface side, at a fall position, the direction in which the silica powder fed from the feeding part moves, while also widening an angle at which the silica powder disperses toward the inner wall surface at the fall position. The apparatus is intended to allow a silica powder layer to be stably formed in the mold in a short period of time.

14 Claims, 10 Drawing Sheets

(51) Int. Cl.
*C30B 15/10* (2006.01)
*C30B 29/06* (2006.01)

(56) References Cited

U.S. PATENT DOCUMENTS

| | | | | |
|---|---|---|---|---|
| 6,174,345 B1 * | 1/2001 | Chen | | H01M 4/383 |
| | | | | 164/471 |
| 6,548,131 B1 * | 4/2003 | Fabian | | C03B 19/095 |
| | | | | 428/318.6 |
| 6,652,934 B1 * | 11/2003 | Miyao | | C30B 15/10 |
| | | | | 428/34.4 |
| 6,699,808 B1 * | 3/2004 | Schwertfeger | | C01B 33/14 |
| | | | | 501/55 |
| 7,350,378 B2 * | 4/2008 | Leist | | C03B 19/095 |
| | | | | 65/17.3 |
| 8,276,402 B2 * | 10/2012 | Sudo | | C03B 19/095 |
| | | | | 65/17.6 |
| 8,769,988 B2 * | 7/2014 | Sudo | | C03B 29/02 |
| | | | | 65/144 |
| 9,133,063 B2 * | 9/2015 | Sudo | | C30B 15/10 |
| 9,534,318 B2 * | 1/2017 | Sudo | | C03C 23/0025 |
| 2004/0115440 A1 * | 6/2004 | Werdecker | | C30B 35/002 |
| | | | | 428/432 |
| 2006/0016389 A1 * | 1/2006 | Holder | | C30B 15/10 |
| | | | | 117/200 |
| 2006/0144327 A1 * | 7/2006 | Ohama | | C30B 15/10 |
| | | | | 117/200 |
| 2009/0155158 A1 * | 6/2009 | Ito | | C01B 33/037 |
| | | | | 423/349 |
| 2009/0320521 A1 * | 12/2009 | Lehmann | | C03B 19/095 |
| | | | | 65/17.6 |
| 2009/0325100 A1 * | 12/2009 | Watanabe | | G03G 9/0815 |
| | | | | 430/105 |
| 2010/0005836 A1 * | 1/2010 | Kishi | | C30B 15/10 |
| | | | | 65/124 |
| 2010/0162760 A1 * | 7/2010 | Fujita | | C30B 15/10 |
| | | | | 65/65 |
| 2010/0236473 A1 * | 9/2010 | Kishi | | C03C 3/06 |
| | | | | 65/33.9 |
| 2010/0319608 A1 * | 12/2010 | Kanda | | C30B 15/10 |
| | | | | 65/33.4 |
| 2011/0183138 A1 * | 7/2011 | Trommer | | C03B 17/04 |
| | | | | 428/338 |
| 2012/0131954 A1 * | 5/2012 | Sudo | | C03B 19/095 |
| | | | | 65/144 |
| 2012/0137733 A1 * | 6/2012 | Sudo | | C03B 29/02 |
| | | | | 65/144 |
| 2012/0137735 A1 * | 6/2012 | Sudo | | C03B 19/095 |
| | | | | 65/33.1 |
| 2012/0167623 A1 * | 7/2012 | Sudo | | G01J 5/0802 |
| | | | | 65/144 |
| 2012/0167624 A1 * | 7/2012 | Sudo | | C03B 19/095 |
| | | | | 65/17.3 |
| 2012/0167625 A1 * | 7/2012 | Sudo | | C03B 19/095 |
| | | | | 65/17.3 |
| 2012/0167627 A1 * | 7/2012 | Sudo | | C03B 19/095 |
| | | | | 65/29.19 |
| 2012/0167628 A1 * | 7/2012 | Sudo | | G01J 5/0022 |
| | | | | 65/29.18 |
| 2012/0285372 A1 * | 11/2012 | Sudo | | C03B 19/095 |
| | | | | 65/17.6 |
| 2013/0196158 A1 * | 8/2013 | Yoshida | | H01M 4/386 |
| | | | | 252/182.1 |
| 2013/0221279 A1 * | 8/2013 | Xu | | H01B 1/00 |
| | | | | 252/301.36 |
| 2015/0114284 A1 * | 4/2015 | Yamagata | | C30B 15/10 |
| | | | | 65/17.3 |
| 2015/0143848 A1 * | 5/2015 | Schenk | | C03C 17/04 |
| | | | | 65/33.4 |
| 2016/0289862 A1 * | 10/2016 | Sudo | | C30B 29/06 |
| 2017/0292204 A1 * | 10/2017 | Sato | | C30B 15/20 |
| 2017/0341968 A1 * | 11/2017 | Schenk | | C03B 19/066 |
| 2018/0361017 A1 * | 12/2018 | Roth | | A61K 29/085 |
| 2019/0046684 A1 * | 2/2019 | Roth | | A61L 27/54 |
| 2019/0085482 A1 * | 3/2019 | Shindo | | C30B 13/14 |
| 2019/0117827 A1 * | 4/2019 | Roth | | A61L 31/022 |
| 2020/0123676 A1 * | 4/2020 | Yoshioka | | C30B 15/10 |
| 2024/0025803 A1 * | 1/2024 | Shimo | | C03B 19/1065 |

FOREIGN PATENT DOCUMENTS

| | | | | |
|---|---|---|---|---|
| DE | 19943103 A1 * | 3/2001 | | B82Y 30/00 |
| EP | 2471754 A2 * | 7/2012 | | C03B 19/095 |
| JP | H01148718 A | 6/1989 | | |
| JP | 2003095678 A | 4/2003 | | |
| JP | 2007045704 A | 2/2007 | | |
| JP | 2007326780 A | 12/2007 | | |
| JP | 2010024137 A | 2/2010 | | |
| JP | 2017149603 A | 8/2017 | | |
| JP | WO2017110763 A1 | 6/2018 | | |
| JP | 6567987 B2 * | 8/2019 | | |
| RU | 2005133822 A * | 5/2007 | | |
| WO | 2017110763 A1 | 6/2017 | | |

OTHER PUBLICATIONS

International Search Report (ISR) mailed Mar. 17, 2020, issued for International application No. PCT/JP2020/000609. (3 pages).

* cited by examiner

[FIG. 1]
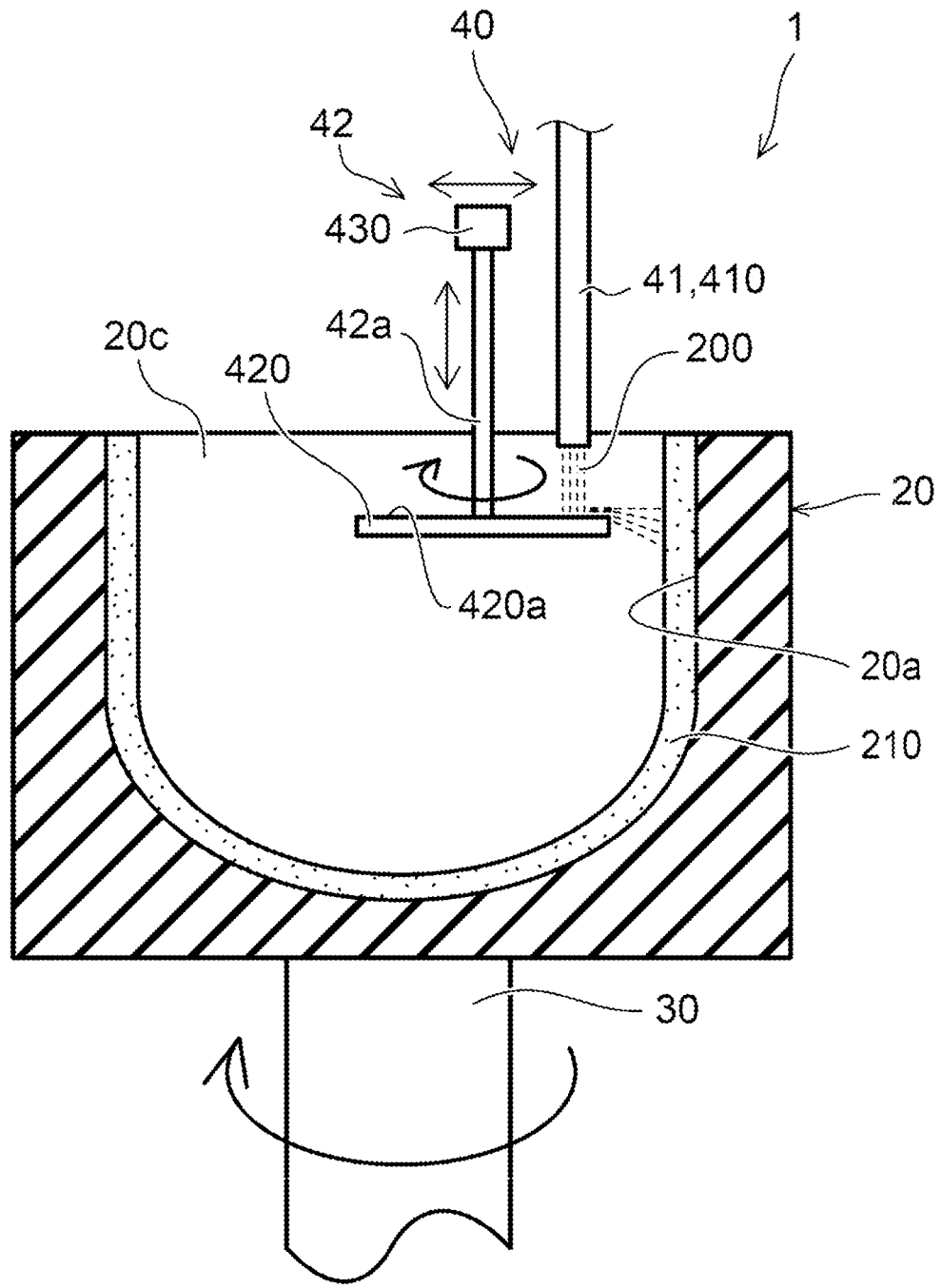

[FIG. 2]
(a)
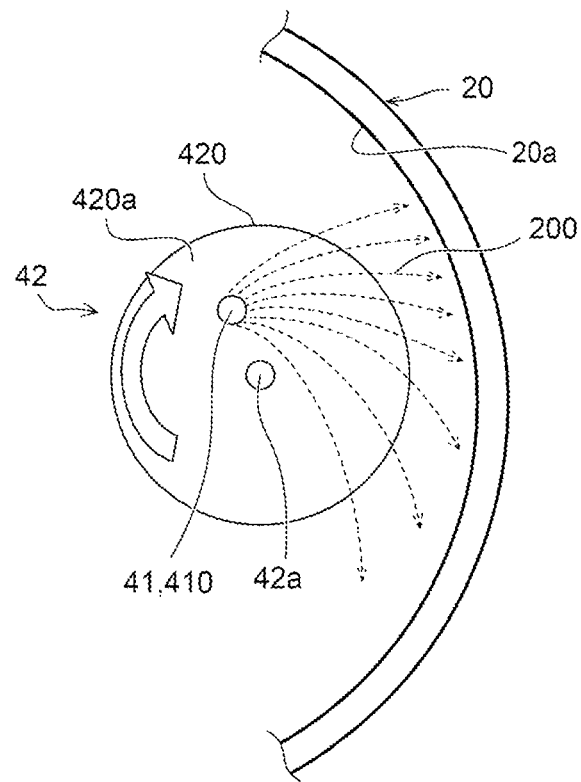
(b)
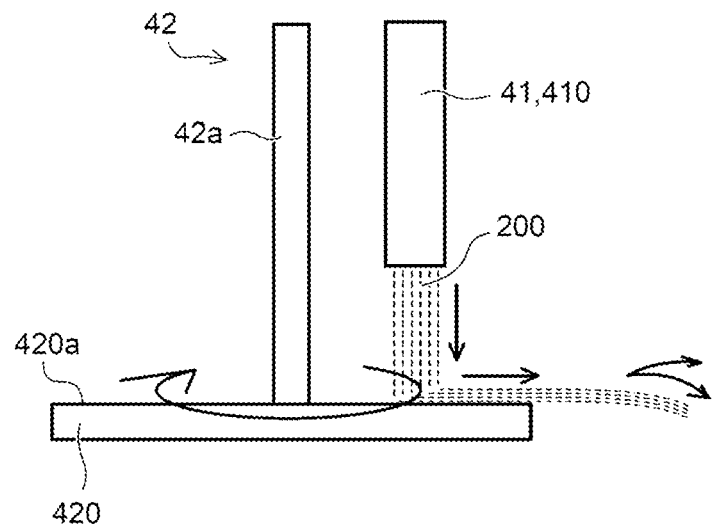

[FIG. 3]
(a)
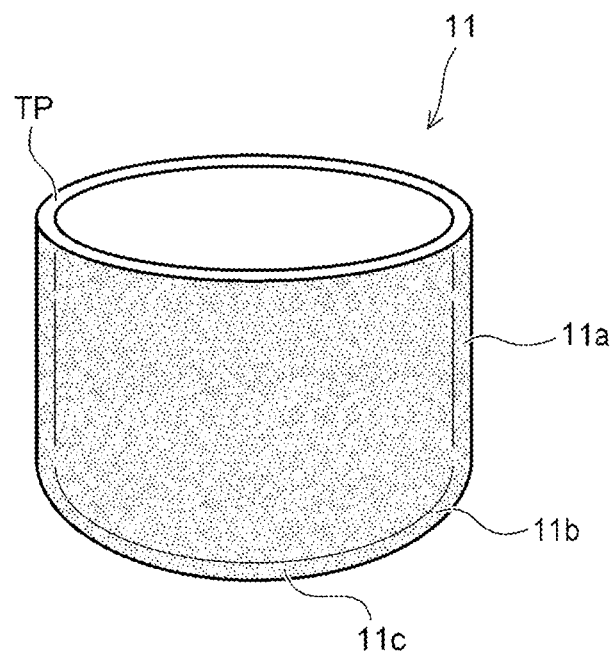
(b)
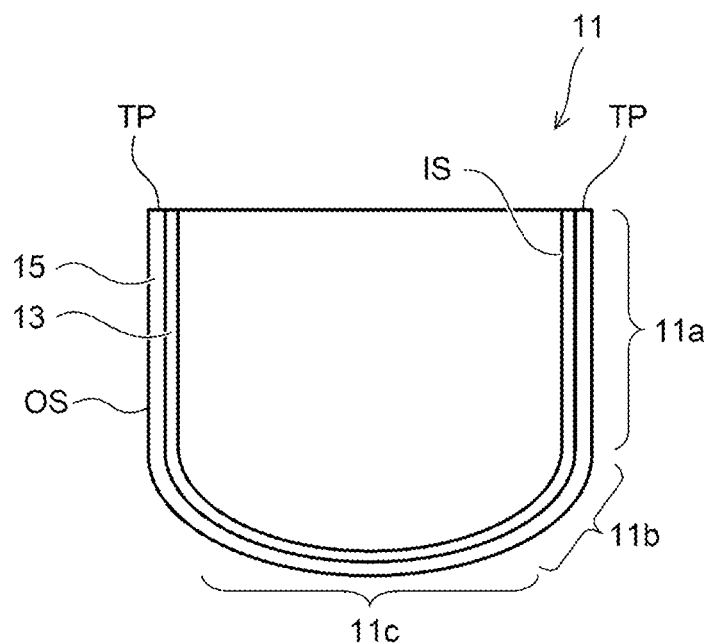

[FIG. 4]
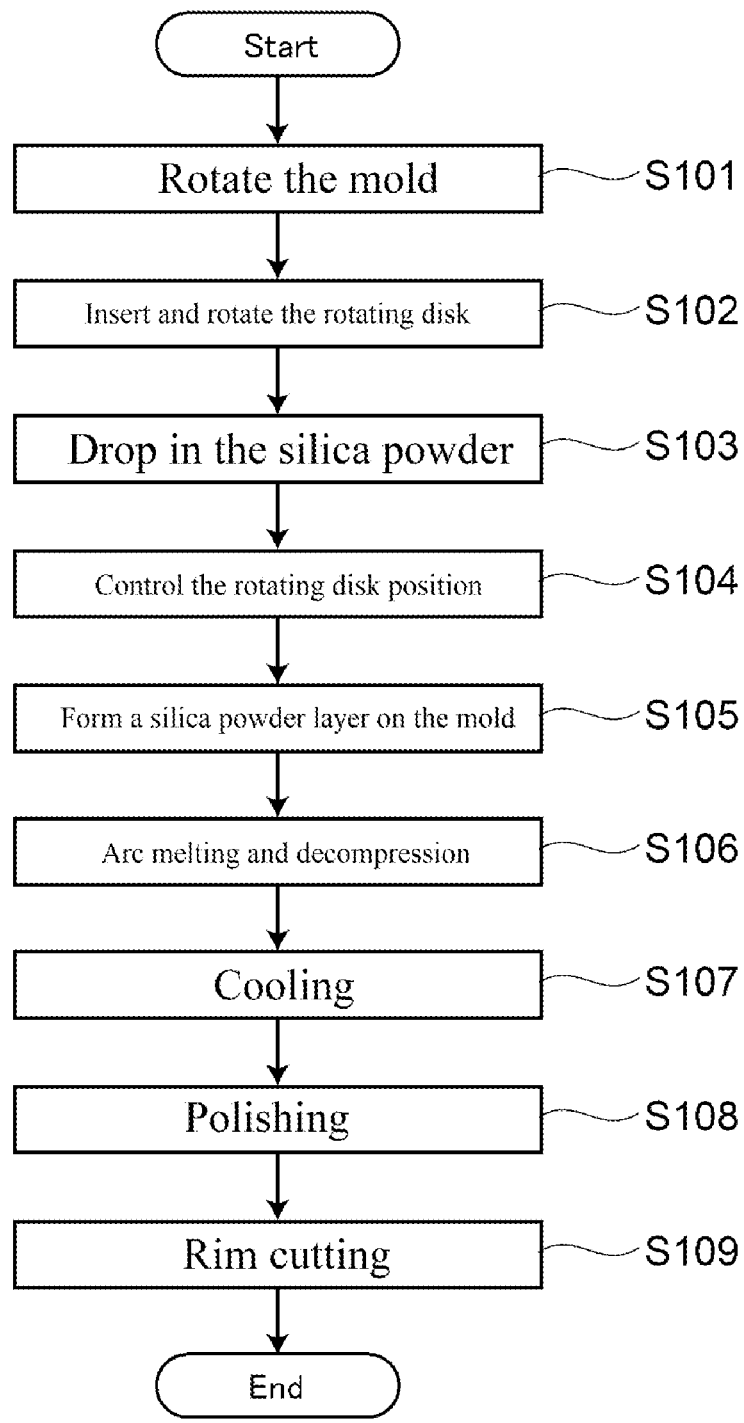

[FIG. 5]
(a)
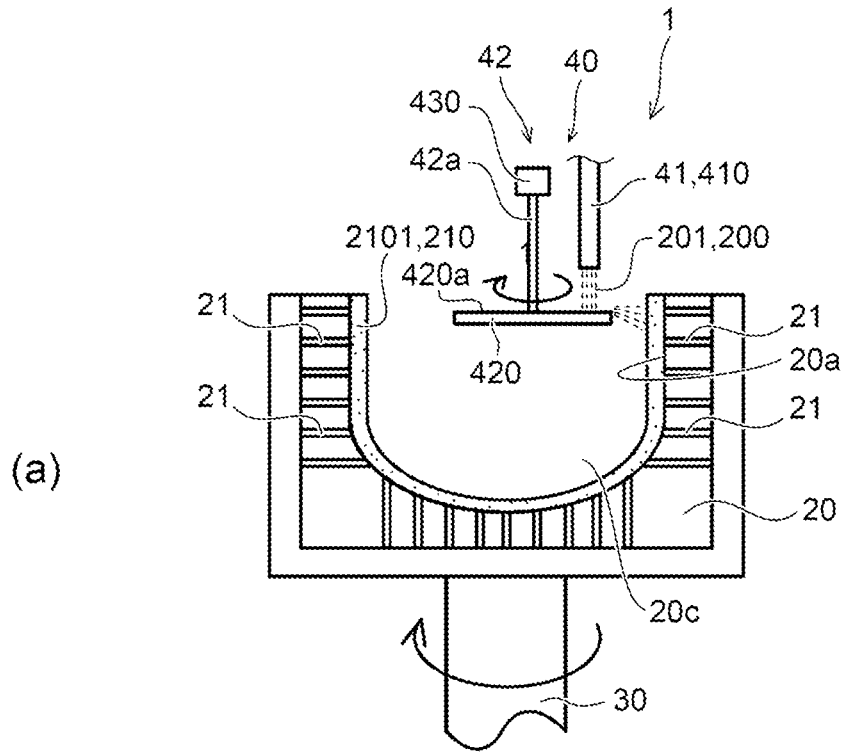
(b)
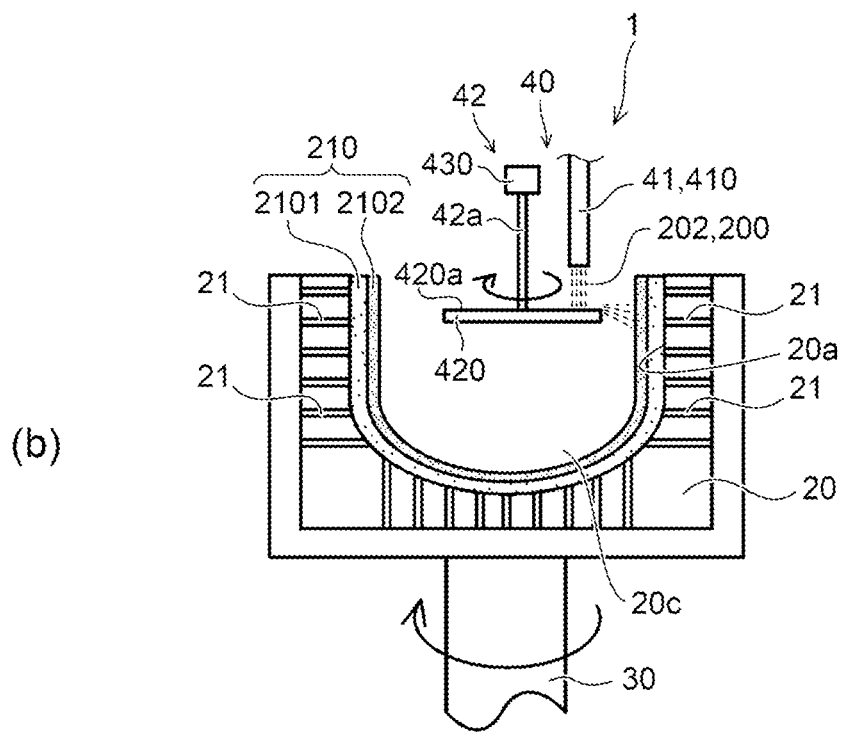

[FIG. 6]
(a)
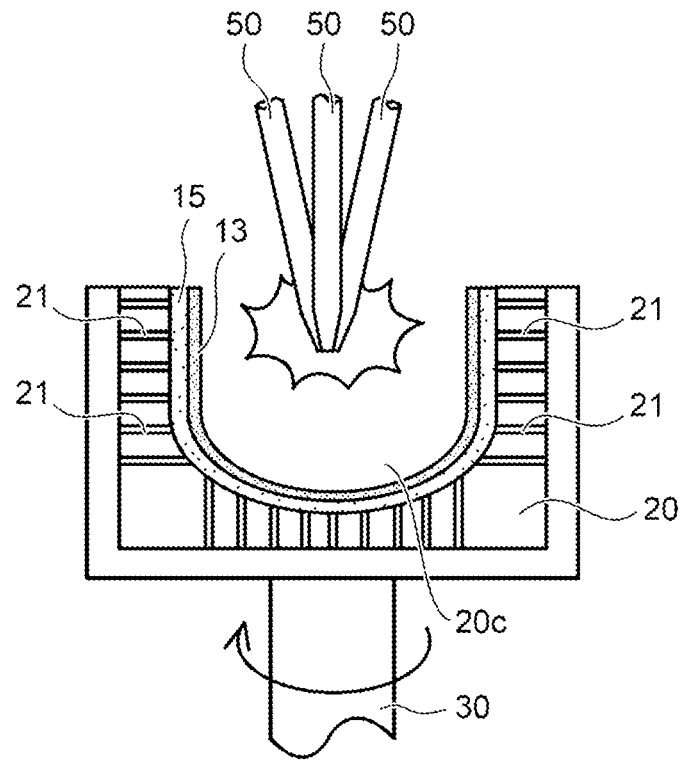
(b)
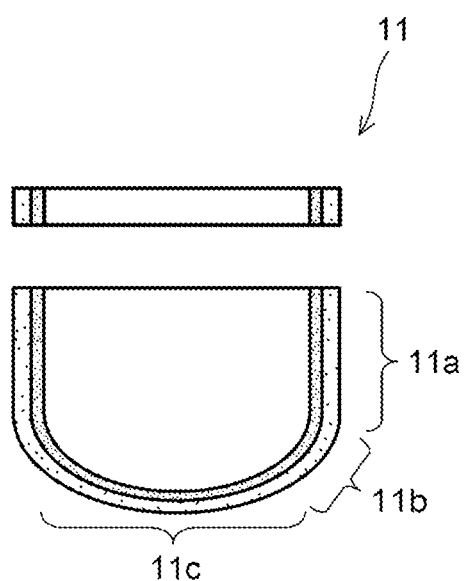

[FIG. 7]
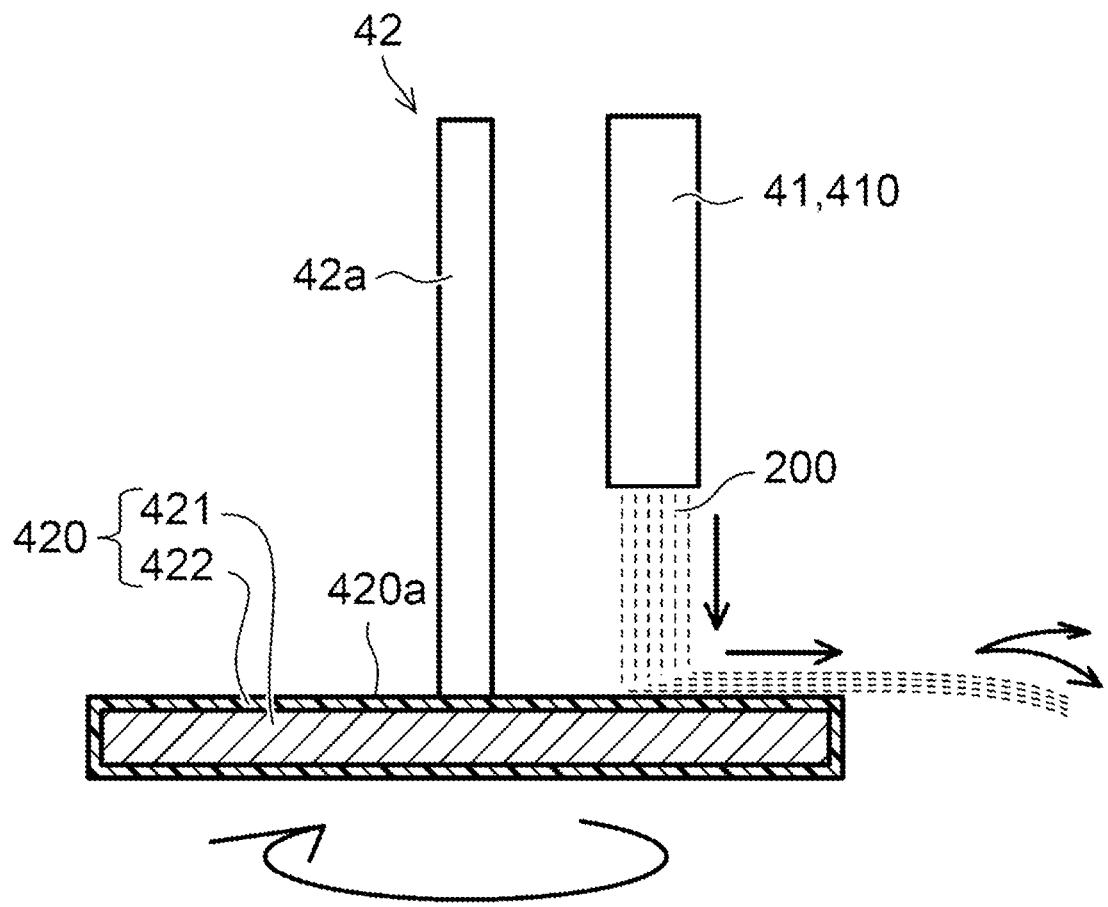

[FIG. 8]
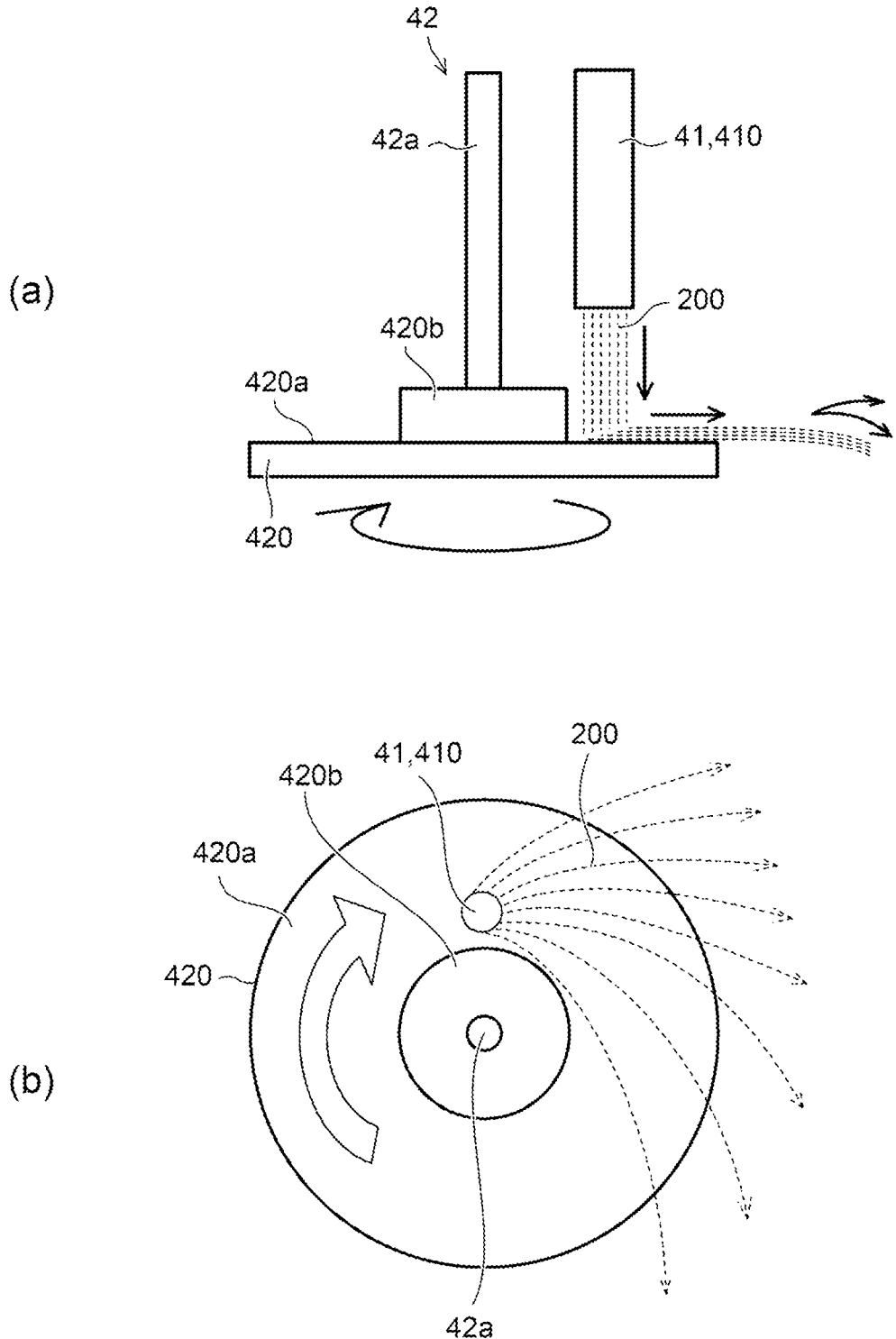

[FIG. 9]
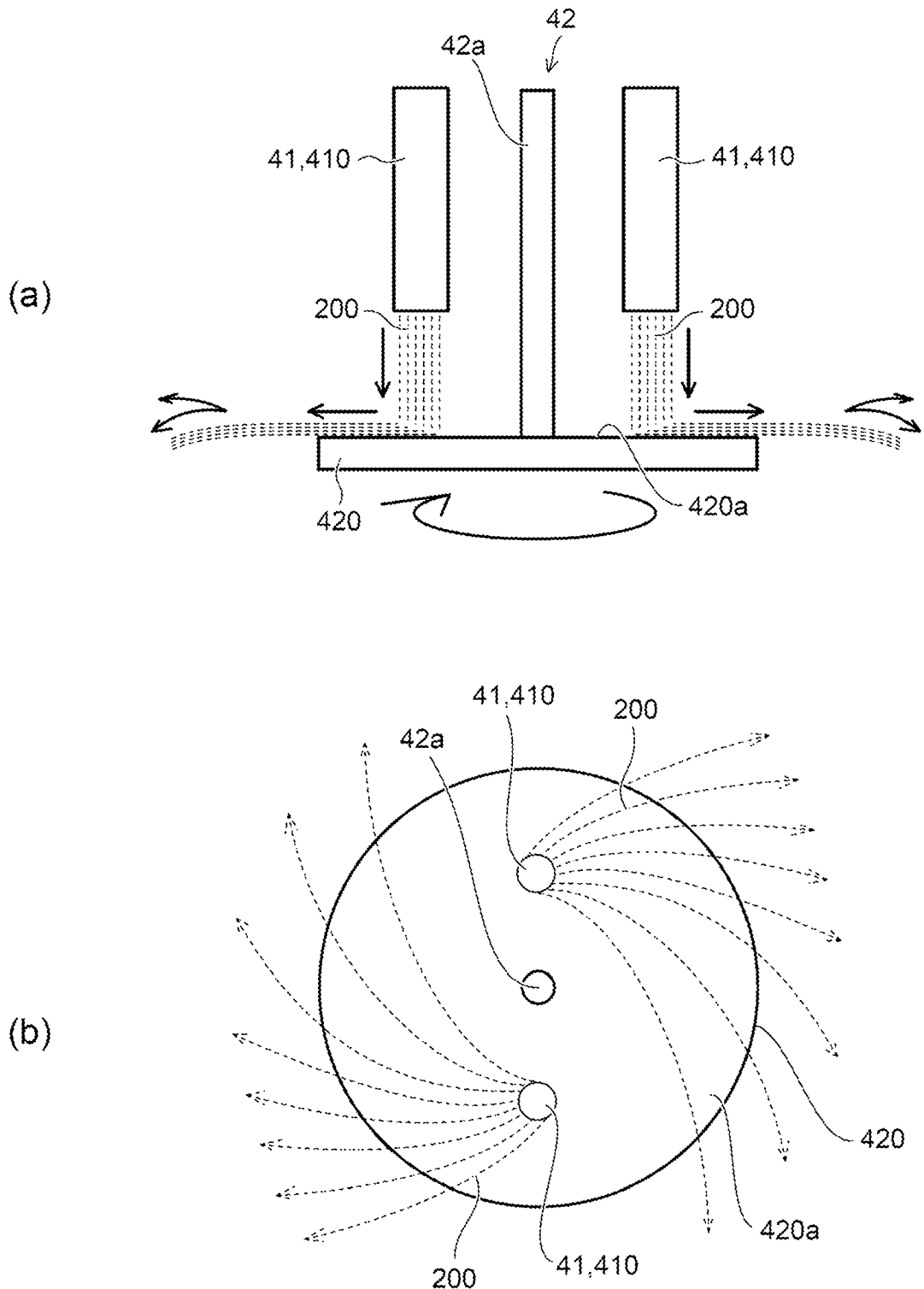

[FIG. 10]
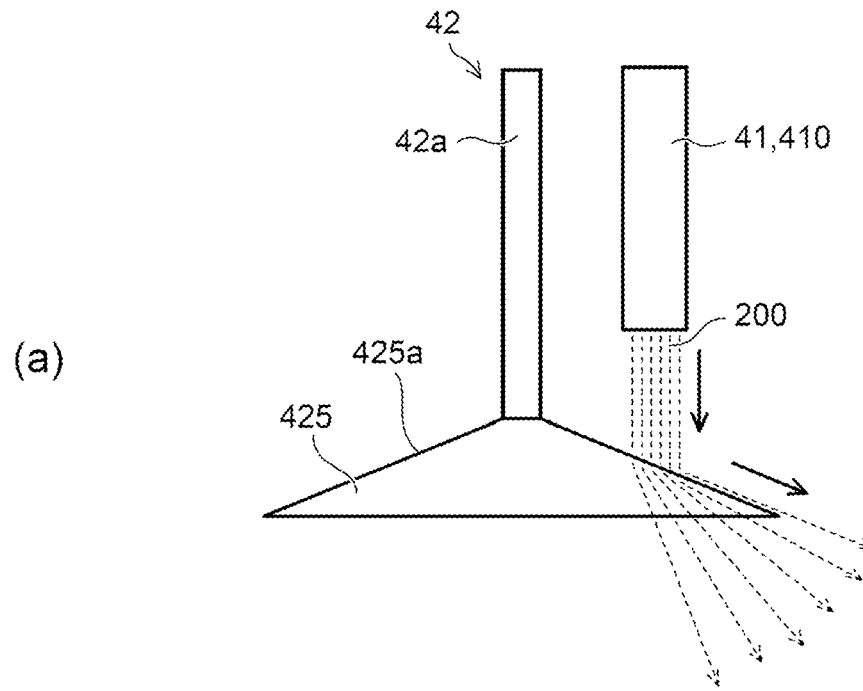
(a)
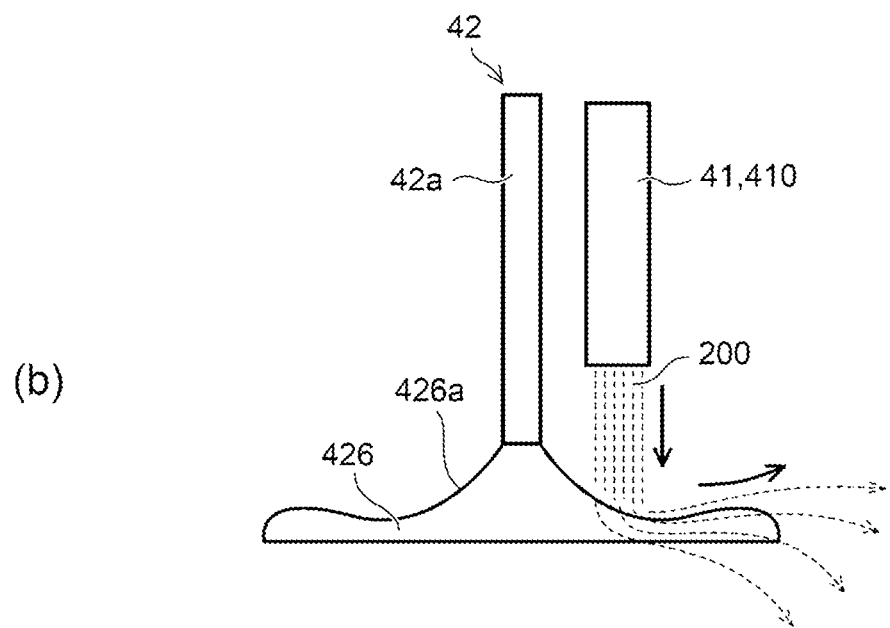
(b)

APPARATUS AND METHOD FOR MANUFACTURING SILICA GLASS CRUCIBLE

CROSS-REFERENCE TO RELATED APPLICATIONS

This application is the U.S. National Phase under 35 U.S.C. § 371 of International Application PCT/JP2020/000609, filed Jan. 10, 2020, which claims priority to Japanese Patent Application No. JP2019-003058, filed Jan. 11, 2019. The International Application was published under PCT Article 21(2) in a language other than English.

TECHNICAL FIELD

The present invention relates to an apparatus and a method for manufacturing a silica glass crucible.

BACKGROUND ART

A silicon single crystal is manufactured by melting a silicon material (polysilicon) filled in a silica glass crucible, causing a seed crystal to contact the molten polysilicon, and then pulling up the seed crystal while rotating it at the same time (CZ method: Czochralski method). Silica glass crucibles used under this CZ method are manufactured based on the rotary mold method.

The method for manufacturing a silica glass crucible based on the rotary mold method comprises: a silica powder layer formation process to deposit a silica powder of approx. 100 to 400 μm in average grain size inside a rotating mold by utilizing centrifugal force, to form a silica powder layer; and an arc melting process to arc-melt the silica powder layer while decompressing it from the mold side, to form a silica glass layer.

In the silica powder layer formation process, a natural quartz powder layer is formed on the inside of the mold, and then a synthetic silica powder layer is formed on the natural quartz powder layer. In the arc melting process, the silica powder is melted while being decompressed at the same time, to remove bubbles and thereby form a transparent silica glass layer (hereinafter also referred to as "transparent layer"). Next, the degree of decompression is reduced to form a bubble-containing silica glass layer (hereinafter also referred to "non-transparent layer") in which bubbles remain. This way, a silica glass crucible of multi-layer structure comprising a transparent layer on the inner-surface side and a non-transparent layer on the outer-surface side, and further comprising a synthetic layer (layer formed by melting the synthetic silica powder) on the inner-surface side, and a natural layer (layer formed by melting the natural quartz powder) on the outer-surface side, is formed.

With regard to the formation of a silica powder layer in the manufacturing of a silica glass crucible as mentioned above, Patent Literature 1 discloses a method for manufacturing a quartz glass crucible that allows for selective multi-layering and layer thinning in specific areas of the quartz glass crucible, while reducing bubbles that remain near the layer boundary. This method for manufacturing includes: a process to spray a quartz glass material powder into a rotating crucible molding tool (mold) in an unheated, non-melting environment, to form a quartz glass compact; and a process to heat and melt the quartz glass compact and then subsequently cooling it, to form a quartz glass crucible.

BACKGROUND ART LITERATURE

Patent Literature

Patent Literature 1: Japanese Patent Laid-open No. 2017-149603

SUMMARY OF THE INVENTION

Problems to be Solved by the Invention

In the silica powder layer formation process based on the rotary mold method, it is very difficult to form a silica powder layer at a desired position to a desired thickness when introducing the silica powder to the rotating mold to deposit a silica powder layer on the inner wall surface of the mold by utilizing centrifugal force. To be specific, various conditions must be considered, such as centrifugal force determined by the size (inner diameter of the cavity) and number of revolutions of the mold, as well as the grain size of the silica powder and its introduction position, quantity, and environment, which makes the control needed to stably form a desired silica powder layer far from simple. Accordingly, much of the formation of a silica powder layer relies on the experience of the operator who introduces the silica powder.

Also, when the silica powder is sprayed onto the inner wall surface of the mold to form a silica powder layer, a problem occurs where the material powder constituting the already-formed silica powder layer is collapsed by the spray pressure (such as gas pressure). Especially when the spray quantity of silica powder is increased with an intention of forming a silica powder layer in a short period of time, such collapse of the material powder becomes notable.

The quality of the silica glass crucible manufactured based on the rotary mold method as mentioned above, is closely related to the quality of silicon single crystals (silicon ingots) that will be obtained by silicon single crystal pull-up (according to the CZ method, for example) using the silica glass crucible. If the silica glass crucible contains metal impurities, for example, the metal impurities may mix into the molten silicon as a silicon single crystal is pulled up, and a dislocation may occur in the silicon ingot. Accordingly, the formation of a silica powder layer under the rotary mold method is an important process that will determine the quality of silicon single crystals.

An object of the present invention is to provide an apparatus and a method for manufacturing a silica glass crucible, both allowing a stable silica powder layer to be formed in a mold in a short period of time.

Means for Solving the Problems

One embodiment of the present invention is an apparatus for manufacturing a silica glass crucible, by forming a silica powder layer on the inside of a rotating mold, which comprises a rotating means for rotating the mold as well as a supply means for feeding a silica powder to the inside of the mold. In this manufacturing apparatus, the supply means has a feeding part for feeding the silica powder in a manner releasing it to fall to a position away from the inner wall surface of the mold on the inside of the mold, as well as a dispersing part for changing, to one toward the inner wall surface side, at the fall position, the direction in which the silica powder fed from the feeding part moves, while also widening the angle at which the silica powder disperses toward the inner wall surface at the fall position.

According to such constitution, what happens when forming a silica powder layer on the inner wall surface of the mold is that the silica powder that has fallen inside the mold travels through the dispersing part so that its moving direction is changed at the fall position to one toward the inner wall surface side, while its angle of dispersion toward the inner wall surface also widens at the fall position. This lets the silica powder land on the inner wall surface of the mold over a wide range in a short period of time.

In the aforementioned apparatus for manufacturing a silica glass crucible, the dispersing part has a rotating disk, and the rotating disk may be provided in a manner that the silica powder fed from the feeding part is received on the surface of the rotating disk. This way, the silica powder that has fallen onto the surface (top face) of the rotating disk rolls on the surface of the rotating disk and accelerates due to centrifugal force, and flies off from the rotating disk toward the inner wall surface of the mold.

In the aforementioned apparatus for manufacturing a silica glass crucible, preferably the dispersing part has a drive mechanism for changing the relative positions of the rotating disk and inner wall surface. This allows for adjustment of the positions to which the silica powder flies, as well as the position in the height direction of the inner wall surface of the mold.

In the aforementioned apparatus for manufacturing a silica glass crucible, preferably the surface hardness of the rotating disk is 5 or higher based on Mohs hardness. Here, the Mohs hardness is determined by scratching the surface with the standard minerals accompanying the Mohs scale and checking whether or not each mineral leaves scratch marks. This way, scratching of the surface of the rotating disk can be reduced even when the silica powder comes in contact with the surface of the rotating disk.

In the aforementioned apparatus for manufacturing a silica glass crucible, preferably the diameter of the rotating disk is 9 percent or greater but no greater than 76 percent of the inner diameter of the mold. If the diameter of the rotating disk is smaller than 9 percent of the inner diameter of the mold, a sufficient quantity of silica powder can no longer be received by the rotating disk. If the diameter of the rotating disk exceeds 76 percent of the inner diameter of the mold, on the other hand, handling the rotating disk becomes difficult when putting the disk into/taking it out of the mold. Furthermore, the dispersion angle of the silica powder becomes too wide on the rotating disk, causing frequent variations in the quantity of silica powder that attaches to the mold.

In the aforementioned apparatus for manufacturing a silica glass crucible, preferably the metal impurity concentration in the surface material of the rotating disk is 20 ppm or lower per element. This way, metal impurities that generate from the rotating disk when the silica powder comes in contact with the rotating disk, and thus mix into the silica powder layer, can be reduced.

Another embodiment of the present invention is a method for manufacturing a silica glass crucible, by forming a silica powder layer on the inside of a rotating mold, which comprises: a process to release a silica powder to fall inside the mold while the mold is rotating; a process to form a silica powder layer by changing, to one toward the inner wall surface side, at the fall position, the direction in which the dropped silica powder moves, while also widening the angle at which the silica powder disperses toward the inner wall surface at the fall position, to cause the silica powder to scatter to the inner wall surface side; and a process to melt and then cool the silica powder layer.

According to such constitution, what happens when forming a silica powder layer on the inner wall surface of the mold is that the moving direction of the silica powder that has fallen inside the mold is changed to one toward the inner wall surface side, at the fall position, while its angle of dispersion toward the inner wall surface also widens at the fall position. This lets the silica powder land on the inner wall surface of the mold over a wide range in a short period of time.

In the aforementioned method for manufacturing a silica glass crucible, the process to form a silica powder layer may be such that the fallen silica powder is received on the surface of a rotating disk to change the direction of the silica powder and widen its dispersion angle. This way, the silica powder that has fallen onto the surface of the rotating disk rolls on the surface of the rotating disk and accelerates due to centrifugal force, and flies off from the rotating disk toward the inner wall surface of the mold.

In the aforementioned method for manufacturing a silica glass crucible, preferably the process to form a silica powder layer is such that the thickness of the silica powder layer is controlled by changing the relative positions of the rotating disk and inner wall surface. This allows for adjustment of the positions to which the silica powder flies, as well as the position in the height direction of the inner wall surface of the mold.

In the process to form a silica powder layer under the aforementioned method for manufacturing a silica glass crucible, preferably the number of revolutions of the rotating disk is 100 rpm or higher but no higher than 5000 rpm. A number of revolutions of the rotating disk faster than 5000 rpm causes the silica powder to scatter excessively, while a number of revolutions slower than 100 rpm makes the silica powder less likely to attach to the inner wall surface of the mold because it is not released at a sufficient speed in the horizontal direction.

Effects of the Invention

According to the present invention, an apparatus and a method for manufacturing a silica glass crucible can be provided, both allowing a stable silica powder layer to be formed in a mold in a short period of time.

BRIEF DESCRIPTION OF THE DRAWINGS

FIG. 1 A schematic cross-sectional view illustrating the apparatus for manufacturing a silica glass crucible pertaining to the embodiment.

FIGS. 2 (*a*) and (*b*) are schematic views illustrating the dispersing part.

FIGS. 3 (*a*) and (*b*) are schematic views illustrating the silica glass crucible.

FIG. 4 A flowchart outlining the processes to manufacture the silica glass crucible.

FIGS. 5 (*a*) and (*b*) are schematic views for explaining the method for manufacturing the silica glass crucible.

FIGS. 6 (*a*) and (*b*) are schematic views for explaining the method for manufacturing the silica glass crucible.

FIG. 7 A schematic view explaining another supply means.

FIGS. 8 (*a*) and (*b*) are schematic views explaining another supply means.

FIGS. 9 (*a*) and (*b*) are schematic views explaining another supply means.

FIGS. 10 (a) and (b) are schematic views explaining other supply means.

MODE FOR CARRYING OUT THE INVENTION

One embodiment of the present invention is explained below based on the drawings. It should be noted that, in the following explanations, the same members are denoted by the same symbols and explanation of members that have already been explained once is skipped as deemed appropriate.

FIG. 1 is a schematic cross-sectional view illustrating the apparatus for manufacturing a silica glass crucible pertaining to this embodiment.

FIGS. 2 (a) and (b) are schematic views illustrating the dispersing part.

FIG. 2 (a) shows a plan view of the dispersing part 42, while FIG. 2 (b) shows a side view of the dispersing part 42.

FIGS. 3 (a) and (b) are schematic views illustrating the silica glass crucible.

FIG. 3 (a) shows a perspective view of the silica glass crucible 11, while FIG. 3 (b) shows a cross-sectional view of the silica glass crucible 11.

<Silica Glass Crucible>

First, the silica glass crucible 11 manufactured by the manufacturing apparatus 1 pertaining to this embodiment is explained.

As shown in FIG. 3, the silica glass crucible 11 has a corner part 11b having a relatively large curvature, a cylindrical side wall part 11a with a rim part that opens to the top face, and a mortar-like bottom part 11c that is flat or curved at a relatively small curvature.

In this embodiment, the corner part 11b is a part that connects the side wall part 11a and the bottom part 11c, and refers to the part extending from the point at which the tangent line to the curved line of the corner part 11b overlaps the side wall part 11a of the silica glass crucible 11, to the point at which the corner part 11b shares the same tangential line with the bottom part 11c. In other words, the point at which the side wall part 11a of the silica glass crucible 11 starts to curve defines the boundary between the side wall part 11a and the corner part 11b. Also, the part of the bottom of the silica glass crucible 11 where the curvature is virtually constant represents the bottom part 11c, while the point at which the curvature starts to change as the distance from the center of the bottom of the silica glass crucible 11 increases defines the boundary between the bottom part 11c and the corner part 11b.

In the wall thickness direction (also referred to as "thickness direction") of the silica glass crucible 11, a transparent layer 13 is provided on the inner surface (hereinafter also referred to "inner surface IS") side of the crucible, while a non-transparent layer 15 is provided on the outer surface (hereinafter also referred to as "outer surface OS") side of the crucible.

The transparent layer 13 is a layer virtually free from bubbles. Here, "virtually free from bubbles" means having a bubble content rate, and a bubble size, that do not cause the single crystallization rate of a silicon single crystal to fall due to bubbles. For example, the bubble content rate of the transparent layer 13 is 0.1 percent or lower, while the average diameter of bubbles therein is 100 μm or smaller.

Preferably the transparent layer 13 contains a synthetic silica glass on the inner surface IS side. "Synthetic silica glass" refers to a silica glass manufactured by melting a material synthesized by hydrolyzing a silicon alkoxide, for example. In general, synthesized silicas are lower in metal impurity concentration and higher in OH group concentration compared to natural quartzes. For example, the content of each metal impurity in a synthetic silica is under 0.05 ppm, while the content of OH groups therein is 30 ppm or higher. However, synthetic silicas to which Al and other metal impurities have been added are also known, and therefore determination of a synthetic silica should not be based on any single factor, but it should instead be based on multiple factors considered in a comprehensive manner. As mentioned above, synthetic silica glasses contain less impurities than natural quartz glasses and thus can prevent increase in impurities that elute from the crucible into the molten silicon, thereby allowing the silicon single crystallization rate to rise.

Many bubbles reside in the non-transparent layer 15. The non-transparent layer 15 is a layer that appears cloudy due to these bubbles. Preferably the non-transparent layer 15 is made of a natural quartz glass. "Natural quartz glass" refers to a silica glass manufactured by melting natural crystals, silica stone, or other natural material. In general, natural quartzes are characterized by higher metal impurity concentration and lower OH group concentration compared to synthetic silicas. For example, the content of Al in a natural quartz is 1 ppm or higher, while the content of alkali metals therein (Na, K and Li) are 0.1 ppm or higher, respectively, and the content of OH groups therein is under 60 ppm.

It should be noted that determination of a natural quartz should not be based on any single factor, but it should instead be based on multiple factors considered in a comprehensive manner. Natural quartzes are higher in viscosity than synthetic silicas at high temperature and thus can increase the high-temperature strength of the entire crucible. Also, natural materials are cheaper than, and therefore have cost advantage over, synthetic silicas.

<Apparatus for Manufacturing Silica Glass Crucible>

Next, the apparatus 1 for manufacturing the silica glass crucible 11 pertaining to this embodiment is explained.

As shown in FIG. 1, the manufacturing apparatus 1 is an apparatus for forming a silica powder layer 210 on an inner wall surface 20a of a mold 20 when manufacturing the aforementioned silica glass crucible 11 based on the rotary mold method. The material for the mold 20 may be carbon, etc., for example. The manufacturing apparatus 1 comprises a rotating means 30 for rotating the mold 20, and a supply means 40 for feeding a silica powder 200 into a cavity 20c representing the inside of the mold 20.

The cavity 20c of the mold 20 has a concave shape conforming to the outer shape of the silica glass crucible 11 to be manufactured. The rotating means 30 is placed below the mold 20 and rotates the mold 20 around the bottom center of the cavity 20c of the mold 20.

The supply means 40 has a feeding part 41 and a dispersing part 42. The feeding part 41 delivers the silica powder 200 in a manner releasing it to fall to a position away from the inner wall surface 20a inside (in the cavity 20c) of the mold 20. In this embodiment, the feeding part 41 has, for example, a charging means for releasing the silica powder 200 to fall. The charging means may be a tube, pail, scoop, etc., for releasing the silica powder 200 to fall. In this embodiment, an example where the silica powder 200 is released to fall by a charge tube 410 serving as the charging means is shown.

The dispersing part 42 has a function to change, to one toward the inner wall surface 20a side at the fall position, the direction in which the silica powder 200 fed from the feeding part 41 moves, while also widening the angle at which the silica powder 200 disperses toward the inner wall surface 20a at the fall position.

The dispersing part 42 has a rotating disk 420. The rotating disk 420 is, for example, a disk-shaped sheet material with an axis 42a provided at the center. The axis 42a is provided in a manner rotatable by a drive mechanism 430. In other words, the rotating disk 420 is provided in a manner horizontally rotatable by rotary driving of the drive mechanism 430. It should be noted that the rotating disk 420 is not necessarily limited to being shaped like a disk, and it may have a square shape or polygonal shape instead.

Also, the drive mechanism 430 has a mechanism by which to move the rotating disk 420 in the vertical direction (depth direction of the cavity 20c). The drive mechanism 430 can change the height of the rotating disk 420 by causing the axis 42a to advance or retreat in the vertical direction, for example. It should be noted that the drive mechanism 430 may have a mechanism by which to move the rotating disk 420 in the lateral direction (opening diameter direction of the cavity 20c). The drive mechanism 430 allows the relative positions of the rotating disk 420 and inner wall surface 20a to be changed.

The feeding port of the charge tube 410 is placed above the rotating disk 420. This causes the silica powder 200 introduced from the feeding port of the charge tube 410 to fall onto a top face 420a of the rotating disk 420. Then, the silica powder 200 that has fallen onto the top face 420a of the rotating disk 420 receives centrifugal force due to the rotation of the rotating disk 420 and spreads outward.

In other words, the moving direction of the silica powder 200 is changed from the falling direction (direction of heading toward the fall position from the feeding port of the charge tube 410), to the outward direction along the top face 420a of the rotating disk 420 (direction of heading toward the inner wall surface 20a of the mold 20 from the fall position). Furthermore, the silica powder 200 advances, while accelerating, on the top face 420a of the rotating disk 420 toward the outer periphery side, and spreads radially. In other words, the silica powder 200 flies out toward the inner wall surface 20a at a widening dispersion angle.

The material for the rotating disk 420 may be a quartz or ceramic (SiC, alumina, zirconium oxide, etc.). Desirably the top face 420a of the rotating disk 420 uses a material subject to little wear, because the silica powder 200 falling from the charge tube 410 hits and rolls on, while in contact with, this face. For example, preferably the Mohs hardness of the surface (top face 420a) of the rotating disk 420 is 5 or higher. This way, wear and scratching of the rotating disk 420 surface can be reduced, even when the silica powder 200 comes in contact with the top face 420a of the rotating disk 420, leading to improved durability. Also, less wear means deformation of the rotating disk 420 is reduced, which allows for stabilization of the scattering direction of the silica powder 200 and thickness of the silica powder 200 attaching to the mold 20. Also, dust generation from the rotating disk 420 surface due to contact with the silica powder 200 can be reduced.

If a quartz is used as the material for the rotating disk 420, preferably it contains no more than 1000 ppm of the highest-content element selected from among alkali metals, aluminum, iron, and calcium, and preferably its metal impurity concentration is 20 ppm or lower per element. This way, metals and other impurities that generate from the rotating disk 420 when the silica powder 200 comes in contact with the rotating disk 420, and mix into the silica powder layer, can be reduced.

Now, if metal impurities mix into the silica powder layer 210, these metal impurities will remain in the silica glass crucible 11 to be manufactured. Use of the silica glass crucible 11 into which metal impurities have mixed to manufacture silicon single crystals according to the CZ method, is a cause of crystal defects. As mentioned above, metal impurities that may mix into the silica glass crucible 11 will not be sufficient quantity-wise to cause crystal defects in the silicon single crystals manufactured according to the CZ method, so long as the metal impurity concentration in the rotating disk 420 is 20 ppm or lower per element. This means that this silica glass crucible 11 can prevent crystal defects from occurring in the silicon single crystals manufactured with it, thus allowing for manufacturing of high-quality silicon single crystals.

The manufacturing apparatus 1 pertaining to this embodiment is such that, when introducing the silica powder 200 to the mold 20, the rotating disk 420 is placed in the cavity 20c of the mold 20, and therefore preferably the diameter of the rotating disk 420 is 9 percent or greater, but no greater than 76 percent, of the inner diameter of the mold 20.

If the diameter of the rotating disk 420 is smaller than 9 percent of the inner diameter of the mold 20, sufficient quantity of silica powder 200 can no longer be received by the rotating disk 420, which reduces the quantity of silica powder 200 to be propelled toward the inner wall surface 20a of the mold 20. As a result, it takes longer to introduce a desired quantity of silica powder 200. If the diameter of the rotating disk 420 exceeds 76 percent of the inner diameter of the mold 20, on the other hand, handling the rotating disk 420 becomes difficult when putting the rotating disk into/taking it out of the mold 20. Furthermore, the dispersion angle of the silica powder 200 becomes too wide on the rotating disk 420, causing frequent variations in the quantity of silica powder 200 that attaches to the mold 20.

<Dispersing Action of Silica Powder>

As shown in FIG. 2 (a), once the silica powder 200 falls to a prescribed position on the top face 420a of the rotating disk 420, the friction between it and the top face 420a causes the silica powder 200 to spread toward the outer periphery due to inertia. Then, the silica powder 200 flies from the outer periphery of the rotating disk 420 and lands on the inner wall surface 20a of the mold 20. In other words, after falling toward the top face 420a of the rotating disk 420 and contacting the top face 420a, the silica powder 200 receives centrifugal force due to the rotating of the rotating disk 420 and changes its moving direction, at the fall position on the top face 420a, to one toward the inner wall surface 20a side of the mold 20.

Furthermore, the path of rolling (advancing) to the outer periphery of the rotating disk 420 changes according to the distance between the position at which the silica powder 200 falls onto the top face 420a and the center of rotation of the rotating disk 420. This means that the dispersion range of the continuously fed silica powder 200 widens toward the outer periphery of the rotating disk 420, causing the silica powder to fly out at a prescribed dispersion angle toward the inner wall surface 20a of the mold 20.

In other words, as shown in FIG. 2 (b), a horizontal-direction component force is applied to the fall-fed (such as gravity-fed) silica powder 200 as it hits the rotating disk 420. The continuously fed silica powder 200 spreads while accelerating and flies out toward the inner wall surface 20a of the mold 20, and lands on the inner wall surface 20a. In this embodiment, there is no need for a gas to spray the silica powder 200 toward the inner wall surface 20a; instead, the fall and the direction change and widening of dispersion angle by the rotating disk 420 allow a lot of silica powder 200 to land over a wide area with high uniformity within a unit of time.

In causing the silica powder 200 to attach, the fact that the mold 20 is rotating allows the silica powder 200, which has flown out toward the inner wall surface 20a from the rotating disk 420, to remain pressed against the inner wall surface 20a side by centrifugal force due to the rotation of the mold 20. As the feeding of silica powder 200 continues, more silica powder 200 deposits gradually on the inner wall surface 20a and eventually a silica powder layer 210 is formed.

Although the rotating direction of the rotating disk 420 may be the same as or opposite to the rotating direction of the mold 20, preferably the two directions are the same. When the rotating direction of the rotating disk 420 is the same as the rotating direction of the mold 20, the relative speed difference between the rotating disk 420 and the mold 20 decreases, which makes it easy to prevent the silica powder 200 from shifting its course in the rotating direction as it flies from the rotating disk 420 and lands on the inner wall surface 20a. As it is prevented from shifting its course in the rotating direction, the silica powder 200 can deposit efficiently in the direction perpendicular to the inner wall surface 20a.

Now, when causing the silica powder 200 to land on the inner wall surface 20a of the mold 20 by utilizing the rotating disk 420, preferably the number of revolutions of the rotating disk 420 is 100 rpm or higher but no higher than 5000 rpm. If the number of revolutions of the rotating disk 420 is higher than 5000 rpm, the silica powder 200 scatters excessively and the quantity of silica powder 200 flying toward the inner wall surface 20a decreases as a result. If the number of revolutions is lower than 100 rpm, on the other hand, the silica powder 200 does not fly out at a sufficient speed in the horizontal direction and is thus less likely to attach to the inner wall surface 20a. A more preferred number of revolutions of the rotating disk 420 is 100 rpm or higher but no higher than 4500 rpm.

<Method for Manufacturing Silica Glass Crucible>

Next, the method for manufacturing the silica glass crucible 11 pertaining to this embodiment is explained.

FIG. 4 is a flowchart outlining the processes to manufacture the silica glass crucible.

Also, FIG. 5 (a) to FIG. 6 (b) are schematic views for explaining the method for manufacturing the silica glass crucible.

The silica glass crucible 11 is manufactured based on the rotary mold method. The rotary mold method is a method whereby a silica powder layer 210 is formed on the inside (inner wall surface 20a) of a rotating mold 20 and then the silica powder layer 210 is arc-melted and cooled, to manufacture the silica glass crucible 11.

First, as shown in Step S101, the mold 20 is rotated. The mold 20 is rotated at such speed that the silica powder 200 to be introduced to its cavity 20c will be retained on the inner wall surface 20a due to centrifugal force.

Next, as shown in Step S102, a rotating disk 420 is inserted and rotated. The rotating disk 420 is inserted in the cavity 20c, and then placed at a prescribed height with a prescribed spacing from the inner wall surface 20a, by a drive mechanism 430. Also, the drive mechanism 430 rotates the rotating disk 420, which has been placed in the cavity 20c, at a prescribed number of revolutions.

Next, as shown in Step S103, the silica powder 200 is fed by falling. To feed the silica powder 200 by falling, the silica powder 200 falls onto the top face 420a of the rotating disk 420 from a charge tube 410 while the rotating disk 420 is rotating, as shown in FIG. 5 (a). This allows the silica powder 200 that has fallen onto the top face 420a of the rotating disk 420 to spread to its outer periphery side due to the friction and inertial force on the rotating disk 420, and fly out toward the inner wall surface 20a of the mold 20.

Next, as shown in Step S104, the position of the rotating disk 420 is controlled. To be specific, the height of the rotating disk 420 and its distance from the inner wall surface 20a are controlled using the drive mechanism 430 while the silica powder 200 is fed by falling continuously. As a result, a silica powder layer 210 is formed on the mold 20, as shown in Step S105. Here, the silica powder 200 is introduced while the relative positions of the rotating disk 420 and inner wall surface 20a are being adjusted. This allows for thickness control of the silica powder layer 210 at a prescribed position concurrently with adjustment of the flying distance of the silica powder 200 as well as the position in the height direction of the inner wall surface 20a of the mold 20.

When forming a silica powder layer 210, it is formed to a prescribed thickness by scraping off any excess of the attached silica powder 200 using a leveling rod, etc. Also, silica powders 200 of different materials may be used in the direction of silica powder 200 deposition. For example, to correspond to the natural layer on the outside, and the synthetic layer on the inside, of the silica glass crucible 11, firstly, as shown in FIG. 5 (a), a first silica powder 201 is introduced, as a silica powder 200, to form a first silica powder layer 2101. Since the first silica powder layer 2101 will become the natural layer of the silica glass crucible 11, a natural quartz powder is used as the first silica powder 201, for example.

Next, as shown in FIG. 5 (b), a second silica powder 202 is introduced, as a silica powder 200, to form a second silica powder layer 2102. Since the second silica powder layer 2102 will become the synthetic layer of the silica glass crucible 11, a synthetic silica powder is used as the second silica powder 202, for example. This way, a silica powder layer 210 of multi-layer structure comprising the second silica powder layer 2102 layered on the first silica powder layer 2101, is formed.

Next, the arc melting and decompression shown in Step S106 are performed. As shown in FIG. 6 (a), arc electrodes 50 are placed in the cavity 20c of the mold 20, and arc discharge is performed from the inside of the mold 20 while the mold 20 is rotating, to heat to 1720° C. or higher and thereby melt the entire silica powder layer 210. At this time, heating is accompanied by decompression from the mold 20 side to suction any gas inside the silica to the outer layer side through ventilation holes 21 provided in the mold 20, thereby degassing the voids in the silica powder layer being heated and thus removing bubbles from the inner surface of the crucible. This way, a transparent layer 13 virtually free from bubbles is formed. The thickness of the transparent layer 13 can be adjusted by the decompression time and pressure.

Although not illustrated, a cooling means is provided for the mold 20. This is to prevent vitrification of the silica in the part that will constitute the outer surface of the silica glass crucible 11. The cooling temperature by the cooling means is a temperature that allows the silica to remain a sintered body and powder without vitrifying.

Thereafter, the decompression for the purpose of degassing is reduced or stopped, while heating is continued, to allow bubbles to remain and thereby form a non-transparent layer 15 that contains many microbubbles.

Next, in the cooling shown in Step S107, power supply to the arc electrodes 50 is stopped and the molten silica glass is cooled, to shape the silica glass crucible 11.

Next, as the polishing shown in Step S108, the outer surface OS of the silica glass crucible 11 is sandblasted to a finish of a prescribed surface roughness. Then, in the rim cutting shown in Step S109, a part of the top edge side of the side wall part 11a of the silica glass crucible 11 that has been taken out of the mold 20 is cut off, to adjust the height of the silica glass crucible 11, as shown in FIG. 6 (b).

According to the aforementioned method for manufacturing the silica glass crucible 11, in the process to form a silica powder layer 210 on the inner wall surface 20a of the mold 20 (Step S102 to Step S105, FIG. 5 (a), (b)), the direction of the silica powder 200 that fell on the inside (in the cavity 20c) of the mold 20 can be changed, at the fall position, to the direction of heading toward the inner wall surface 20a side, while its angle of dispersion toward the inner wall surface 20a can be widened at the fall position. This lets the silica powder 200 land on the inner wall surface 20a of the mold 20 over a wide range in a short period of time and in an efficient manner.

EXAMPLES AND COMPARATIVE EXAMPLES

Next, Examples to which the manufacturing apparatus 1 and method for manufacturing pertaining to this embodiment are applied, as well as Comparative Examples, are explained.

Example 1

A quartz disk (rotating disk 420) was inserted on the inside (in the cavity 20c) of a mold (mold 20) rotating at 60 rpm, and a natural quartz powder fell onto the rotating quartz disk at a rate of 30 kg/min to cause the quartz powder to fly in the horizontal direction and attach to the inner face of the wall part of the mold. At this time, the disk was moved up and down to let the powder attach evenly to the wall part. Thereafter, the powder was shaped using a leveling rod, etc., to form an even natural quartz powder layer on the inner face of the mold. Thereafter, a synthetic quartz powder fell onto the disk that was rotating and moving up and down, to cause the quartz powder to fly in the horizontal direction and attach to the inner face of the wall part of the mold, after which the powder was shaped using a leveling rod, etc., to form an even synthetic quartz powder layer. As a result, a crucible-shaped quartz powder compact comprising two even layers was formed inside the mold.

Comparative Example 1

The natural quartz powder was poured in at a rate of 30 kg/min, without using the rotating disk 420, to the wall part on the inside of the mold rotating at 60 rpm. Some of the natural quartz powder attached to the wall part, but most of it fell to the bottom part of the mold and a quartz powder compact could not be formed.

Comparative Example 2

The natural quartz powder was poured in at a rate of 1 kg/min, without using the rotating disk 420, to the wall part on the inside of the mold rotating at 60 rpm. After the quartz powder had attached to the wall part, it was shaped using a leveling rod, etc., to form a natural quartz powder layer on the inner face of the mold. At this time, a lot of quartz powder sloughed off toward the bottom part, from the wall part, of the mold and the layer thickness became greater at the bottom part than at the wall part. Next, the synthetic quartz powder was poured in to the wall part at the same rate. After the quartz powder had attached to the wall part, it was shaped using a leveling rod, etc., to form a synthetic quartz powder layer on the inner face of the mold. As a result, a crucible-shaped quartz powder compact comprising two layers was formed inside the mold; however, its thickness distribution was skewed thicker at the bottom part than at the wall part.

Example 2

Quartz powder layers were formed under the same conditions as in Example 1 by using a quartz for the rotating disk 420 where the sheet was of high material purity (impurities of Al, Fe and other metals were 18 ppm or lower), followed by arc melting, to produce a quartz crucible. When the synthetic layer on the inner surface of the produced quartz crucible was analyzed, all metal elements were at or below the minimum limit of determination.

Comparative Example 3

Quartz powder layers were formed under the same conditions as in Example 1 by using a quartz for the rotating disk 420 where the sheet was of low material purity (Al, Fe, etc., were 50 ppm or higher), followed by arc melting, to produce a quartz crucible. When the synthetic layer on the inner surface of the produced quartz crucible was analyzed, impurities were detected.

Example 3

Quartz powder layers were formed under the same conditions as in Example 1 by using an alumina ceramic for the rotating disk 420, followed by arc melting, to produce a quartz crucible. This was repeated 300 times, after which the surface (top face 420a) of the rotating disk 420 was measured for irregularities. The depth of depression at the most depressed location was 0.1 mm or less, and the scattering direction of the quartz powder as it fell onto the disk was stable.

Comparative Example 4

Quartz powder layers were formed under the same conditions as in Example 1 by using a vinyl chloride sheet for the rotating disk 420, followed by arc melting, to produce a quartz crucible. This was repeated 300 times, after which the surface (top face 420a) of the rotating disk 420 was measured for irregularities. The depth of depression at the most depressed location reached 1 mm, and the scattering direction of the quartz powder as it fell onto the disk had changed compared to when the disk was new, thereby causing the thickness variation of the material powder attached to the wall part in the mold to increase.

Comparative Example 5, Example 4, Example 5, and Comparative Example 6

In Comparative Example 5, Example 4, Example 5, and Comparative Example 6, the material powder (quartz powder) was compacted by changing the diameter of the rotating disk 420 as shown in Table 1 below.

TABLE 1

|  | Percentage of disk diameter to inner diameter of mold | Percentage of material powder attaching to wall part | Percentage of material powder falling to bottom part from corner part | Compacting of material powder |
|---|---|---|---|---|
| Comparative Example 5 | 5% | 10% | 90% | X |
| Example 4 | 30% | 90% | 10% | ○ |
| Example 5 | 70% | 70% | 30% | ○ |
| Comparative Example 6 | 80% | 50% | 50% | X |

In Comparative Example 5, the quartz powder could not accelerate sufficiently on the top face 420a of the rotating disk 420 and mostly fell to the bottom part of the mold. In Comparative Example 6, a high percentage of the quartz powder moved to the rotating direction on the top face 420a of the rotating disk 420, while a high percentage of it fell to the bottom part instead of the wall part. An attempt to evenly compact the surface of the quartz powder at the wall part using a leveling rod, etc., caused the powder to fall, resulting in a failure to compact the material powder to an even thickness.

Comparative Example 7, Example 6, Example 7, Example 8, and Comparative Example 8

In Comparative Example 7, Example 6, Example 7, Example 8, and Comparative Example 8, the material was compacted by changing the number of revolutions of the rotating disk 420 as shown in Table 2 below.

TABLE 2

|  | Number of revolutions of the disk | Percentage of material powder attaching to wall part | Percentage of material powder falling to bottom part from corner part | Compacting of material powder |
|---|---|---|---|---|
| Comparative Example 7 | 70 rpm | 10% | 90% | X |
| Example 6 | 150 rpm | 60% | 40% | ○ |
| Example 7 | 2000 rpm | 90% | 10% | ○ |
| Example 8 | 4000 rpm | 70% | 30% | ○ |
| Comparative Example 8 | 5500 rpm | 40% | 60% | X |

In Comparative Example 7, the quartz powder could not accelerate sufficiently on the top face 420a of the rotating disk 420 and mostly fell to the bottom part of the mold. In Comparative Example 8, a high percentage of the quartz powder moved to the rotating direction on the top face 420a of the rotating disk 420, while a high percentage of it fell to the bottom part instead of the wall part. An attempt to evenly compact the surface of the quartz powder at the wall part using a leveling rod, etc., caused the powder to fall, resulting in a failure to compact the material powder to an even thickness.

Comparative Example 9

The natural quartz powder was sprayed from a nozzle onto the inside of the mold rotating at 60 rpm. A natural quartz powder layer was formed at a carrier gas flow rate of 2.0 m/s. Next, the synthetic quartz powder was sprayed from a nozzle to form a synthetic quartz powder layer. This was performed at a carrier gas flow rate of 2.0 m/s, but the natural quartz powder in the sprayed part crumbled due to gas pressure, rendering the thickness of the natural quartz powder layer no longer even.

<Other Supply Means>

Next, other supply means 40 are explained.

FIG. 7 to FIG. 10 (b) are schematic views explaining other supply means.

FIG. 7 shows another example of a rotating disk 420. The rotating disk 420 shown in FIG. 7 has a support member 421 being a disk-shaped sheet material, and a cover member 422 covering the surface of the support member 421.

As the material for the support member 421, metal, resin, ceramic, etc., is used. As the material for the cover member 422, fluororesin, rubber or other resin material having elasticity is used. This way, the elasticity of the cover member 422 will reduce scratches and wear on the support member 421 even when the silica powder 200 comes in contact with the top face 420a of the rotating disk 420. It should be noted that, even if the cover member 422 wears out and partially peels off, the peeled part will be lost in the arc melting process during the manufacturing of the silica glass crucible 11, and will not remain as impurities. Preferably, however, the impurity concentrations of metal elements, etc., that will not be lost, are 20 ppm or lower per element.

FIGS. 8 (a) and (b) show an example of a rotating disk 420 having a step. FIG. 8 (a) shows a side view of the rotating disk 420, while FIG. 8 (b) shows a plan view of the rotating disk 420. This rotating disk 420 is provided with a step part 420b in the center part of the top face 420a. To introduce the silica powder 200, it falls onto the top face 420a on the outer side of the step part 420b. This allows the silica powder 200 to disperse on the outer side of the step part 420b, so that the range over which the silica powder 200 flies from the rotating disk 420 can be narrowly adjusted.

FIGS. 9 (a) and (b) show an example where multiple charge tubes 410 are provided.

In the example shown in FIG. 9, they are placed on opposite sides to each other across the axis 42a of the rotating disk 420 at the center. As a result, the silica powder 200 introduced from one charge tube 410 disperses on one side of the top face 420*a* of the rotating disk 420 to be discharged, while the silica powder 200 introduced from the other charge tube 410 disperses on the other side of the top face 420*a* of the rotating disk 420 to be discharged.

Use of these supply means 40 allows more silica powder 200 to be introduced over a short period of time. Also, these supply means 40 may be such that the axis 42*a* of the rotating disk 420 is placed on the rotating axis of the mold 20. This allows a desired quantity of silica powder 200 to land over a wide range along the circumferential direction of the inner wall surface 20*a* of the mold 20 both evenly and in a short period of time.

It should be noted that, while FIG. 9 shows an example where two charge tubes 410 are provided, three or more charge tubes 410 may be provided.

FIGS. 10 (*a*) and (*b*) show other examples of dispersing parts 42.

The dispersing part 42 shown in FIG. 10 (*a*) has a conical disk 425. When the conical disk 425 is used, the silica powder 200 falls to a prescribed position on a top face 425*a* of the conical disk 425. As a result, the falling silica powder 200 changes direction on the top face 425*a* and disperses radially along the top face 425*a* to be discharged. When such conical disk 425 is used, it is not necessary to rotate the conical disk 425.

The dispersing part 42 shown in FIG. 10 (*b*) has a curved disk 426. The shape of a top face 426*a* of the curved disk 426 is formed by rotating a prescribed curved line extending from the center toward the outer rim. For example, the top face 426*a* of the curved disk 426 may have a shape constituted by any of various curved lines, such as one formed by rotating a curved line that falls to a midway point from the center toward the outer rim and then rises from the midway point.

When the curved disk 426 is used, the silica powder 200 falls to a prescribed position on the top face 426*a* of the curved disk 426. As a result, the falling silica powder 200 changes direction on the top face 426*a* of the curved disk 426 and disperses radially along the top face 426*a* to be discharged. The path of discharge is controlled by the shape of the top face 426*a*. When such curved disk 426 is used, it is not necessary to rotate the curved disk 426.

It should be noted that the rotating disk 420, conical disk 425 and curved disk 426 explained above may have an adjustable inclination angle to the horizontal direction. This allows for adjustment of the discharge angle, and dispersion angle in the vertical direction, of the silica powder 200 according to the inclination angle.

As explained above, according to this embodiment a stable silica powder layer 210 can be formed in the mold 20 in a short period of time. This makes it possible to provide a silica glass crucible 11 suitable for manufacturing of silicon single crystals for semiconductors based on the CZ method in particular. Also, by implementing the CZ method using this silica glass crucible 11, silicon single crystals (ingots) can be manufactured in a crystal-defect-controlled manner.

It should be noted that, notwithstanding the embodiment explained above, the present invention is not limited to the examples given therein. For example, those skilled in the art may add or delete constitutive elements to/from, or add design changes to, the aforementioned embodiments as deemed appropriate, or may combine the characteristics of the aforementioned embodiments as deemed appropriate, and the outcomes thereof are also included in what is claimed by the present invention so long as they retain the key points of the present invention.

Description of the Symbols

1—Manufacturing apparatus
    11—Silica glass crucible
    11*a*—Side wall part
    11*b*—Corner part
    11*c*—Bottom part
    13—Transparent layer
    15—Non-transparent layer
    20—Mold
    20*a*—Inner wall surface
    20*c*—Cavity
    21—Ventilation hole
    30—Rotating means
    40—Supply means
    41—Feeding part
    42—Dispersing part
    42*a*—Axis
    50—Arc electrode
    200—Silica powder
    201—First silica powder
    202—Second silica powder
    210—Silica powder layer
    410—Charge tube
    420—Rotating disk
    420*a*—Top face
    420*b*—Step part
    421—Support member
    422—Cover member
    425—Conical disk
    425*a*—Top face
    426—Curved disk
    426*a*—Top face
    430—Drive mechanism
    2101—First silica powder layer
    2102—Second silica powder layer
    IS—Inner surface
    OS—Outer surface

What is claimed is:

1. An apparatus for manufacturing a silica glass crucible, by forming a silica powder layer on an inside of a rotating mold, the apparatus for manufacturing a silica glass crucible comprising:
   a rotating means for rotating the mold; and
   a supply means for feeding a silica powder to the inside of the mold;
   wherein the supply means has:
   a feeding part for feeding the silica powder in a manner releasing it to fall to a position away from an inner wall surface of the mold on the inside of the mold; and
   a dispersing part for changing, to one toward the inner wall surface side, at a fall position, a direction in which the silica powder fed from the feeding part moves, while also widening an angle at which the silica powder disperses toward the inner wall surface at the fall position,
   wherein the dispersing part includes a rotating disk having a top surface provided in a manner horizontally rotatable around a rotation axis which is positioned between an axis of the rotating mold and the inner wall surface and away from the axis of the rotating mold and the inner wall surface as viewed in a vertical direction,
   wherein the silica powder falls from the feeding part and drops at the fall position on the top surface while rotating so that the silica powder hit on the top surface moves outward along the top surface toward the inner wall due to centrifugal force exerted from the rotating disk, said fall position being set between the rotation axis of the rotating disk and an outer periphery of the top surface and away from the rotation axis of the rotating disk and the outer periphery of the top surface as viewed in the vertical direction.

2. The apparatus for manufacturing a silica glass crucible according to claim 1, wherein the dispersing part has a drive mechanism for changing relative positions of the rotating disk and the inner wall surface.

3. The apparatus for manufacturing a silica glass crucible according to claim 2, wherein a surface hardness of the rotating disk is 5 or higher based on Mohs hardness.

4. The apparatus for manufacturing a silica glass crucible according to claim 3, wherein a diameter of the rotating disk is 9 percent or greater but no greater than 76 percent of an inner diameter of the mold.

5. The apparatus for manufacturing a silica glass crucible according to claim 3, wherein a material constituting the top surface of the rotating disk has a metal impurity concentration of 20 ppm or lower per element.

6. The apparatus for manufacturing a silica glass crucible according to claim 2, wherein a diameter of the rotating disk is 9 percent or greater but no greater than 76 percent of an inner diameter of the mold.

7. The apparatus for manufacturing a silica glass crucible according to claim 6, wherein a material constituting the top surface of the rotating disk has a metal impurity concentration of 20 ppm or lower per element.

8. The apparatus for manufacturing a silica glass crucible according to claim 2, wherein a material constituting the top surface of the rotating disk has a metal impurity concentration of 20 ppm or lower per element.

9. The apparatus for manufacturing a silica glass crucible according to claim 1, wherein a surface hardness of the rotating disk is 5 or higher based on Mohs hardness.

10. The apparatus for manufacturing a silica glass crucible according to claim 9, wherein a diameter of the rotating disk is 9 percent or greater but no greater than 76 percent of an inner diameter of the mold.

11. The apparatus for manufacturing a silica glass crucible according to claim 9, wherein a material constituting the top surface of the rotating disk has a metal impurity concentration of 20 ppm or lower per element.

12. The apparatus for manufacturing a silica glass crucible according to claim 1, wherein a diameter of the rotating disk is 9 percent or greater but no greater than 76 percent of an inner diameter of the mold.

13. The apparatus for manufacturing a silica glass crucible according to claim 12, wherein a material constituting the top surface of the rotating disk has a metal impurity concentration of 20 ppm or lower per element.

14. The apparatus for manufacturing a silica glass crucible according to claim 1, wherein a material constituting the top surface of the rotating disk has a metal impurity concentration of 20 ppm or lower per element.

* * * * *